US009210809B2

(12) United States Patent  
Mallik et al.

(10) Patent No.: US 9,210,809 B2  
(45) Date of Patent: Dec. 8, 2015

(54) REDUCED PTH PAD FOR ENABLING CORE ROUTING AND SUBSTRATE LAYER COUNT REDUCTION

(71) Applicants: Debendra Mallik, Chandler, AZ (US); Mihir Roy, Chandler, AZ (US)

(72) Inventors: Debendra Mallik, Chandler, AZ (US); Mihir Roy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/097,932

(22) Filed: Dec. 5, 2013

(65) Prior Publication Data

US 2014/0098506 A1    Apr. 10, 2014

Related U.S. Application Data

(62) Division of application No. 12/973,596, filed on Dec. 20, 2010, now Pat. No. 8,617,990.

(51) Int. Cl.
| | |
|---|---|
| *H01L 23/52* | (2006.01) |
| *H01L 23/48* | (2006.01) |
| *H05K 1/11* | (2006.01) |
| *H01L 21/48* | (2006.01) |
| *H01L 23/498* | (2006.01) |

(52) U.S. Cl.
 CPC ............ *H05K 1/115* (2013.01); *H01L 21/4857* (2013.01); *H01L 23/49827* (2013.01); *H01L 23/49822* (2013.01); *H01L 2224/16225* (2013.01)

(58) Field of Classification Search
 CPC ..................... H01L 21/4857; H01L 23/49827; H05K 1/115
 USPC .................................................. 257/773, 774
 See application file for complete search history.

(56) References Cited

U.S. PATENT DOCUMENTS

| | | | | |
|---|---|---|---|---|
| 5,224,265 | A * | 7/1993 | Dux et al. | ......................... 29/852 |
| 6,384,344 | B1 * | 5/2002 | Asai et al. | ..................... 174/261 |
| 6,458,696 | B1 | 10/2002 | Gross | |
| 6,828,224 | B2 * | 12/2004 | Iijima et al. | ................... 438/622 |
| 7,707,716 | B2 * | 5/2010 | Song et al. | ........................ 29/852 |
| 7,749,900 | B2 | 7/2010 | Li et al. | |
| 7,989,081 | B2 * | 8/2011 | Nozaki et al. | .............. 428/473.5 |
| 2003/0011070 | A1 | 1/2003 | Iijima et al. | |
| 2009/0026604 | A1 | 1/2009 | Shin et al. | |
| 2010/0051338 | A1 | 3/2010 | Takai et al. | |
| 2010/0170088 | A1 | 7/2010 | Chang et al. | |

FOREIGN PATENT DOCUMENTS

WO     2012/087552 A1    6/2012

OTHER PUBLICATIONS

Office Action received for Taiwanese Patent Application 100145057, mailed on Sep. 25, 2013, 21 pages of office action including 13 pages of English translation.
International Preliminary Report on Patentability for PCT Application No. PCT/US2011/063348, mailed on Jul. 4, 2013, 7 pages.
International Search Report and Written Opinion received for PCT Patent Application No. PCT/US2011/063348, mailed on May 31, 2013, 5 pages.
Office Action Received for Taiwan Patent Application No. 100145057, mailed on May 29, 2014, 26 pages of Office Action including 16 pages of English Translation.

* cited by examiner

*Primary Examiner* — Luan C Thai
(74) *Attorney, Agent, or Firm* — Winkle, PLLC

(57) ABSTRACT

Embodiments are directed to semiconductor packaging having reduced sized plated through hole (PTH) pads by eliminating the margin of the pad-to-PTH alignment and enabling finer traces on the core of the substrate.

13 Claims, 4 Drawing Sheets

REDUCED PTH PAD FOR ENABLING CORE ROUTING AND SUBSTRATE LAYER COUNT REDUCTION

RELATED APPLICATIONS

The present application is a Divisional of U.S. application Ser. No. 12/973,596 filed Dec. 20, 2010, entitled "REDUCED PTH PAD FOR ENABLING CORE ROUTING AND SUBSTRATE LAYER COUNT REDUCTION".

FIELD OF THE INVENTION

Embodiments of the present invention are directed to semiconductor packaging and, more particularly, to reduced sized plated through hole (PTH) pads by eliminating the margin of the pad-to-PTH alignment and enabling finer traces on the core of the substrate.

BACKGROUND INFORMATION

A printed circuit board ("PCB") is a multilayer board that includes printed circuits on one or more layers of insulative (a.k.a. dielectric) material. A printed circuit is a pattern of conductors that corresponds to the wiring of an electronic circuit formed on one or more layers of insulative material. The printed circuit board includes electrical traces that are routed on the various layers of the PCB. PCBs also include vias which are solid electrical paths connecting one layer to another layer. A via can be used to connect a trace on one layer of a PCB to another trace on another layer of the PCB.

A PCB also includes other layers of metallization for ground planes, power planes or reference voltage planes. In many instances a signal carrying via must be routed through one or more of these planes. The signal carrying via cannot electrically connect or couple to these planes. If the signal carrying via does couple or connect to one of these planes, the integrity of the electrical circuit is compromised. As a result, anti-pads or plane clearances are required to separate signal carrying vias from ground planes, power planes, or planes having a reference voltage. An anti-pad is a plane clearance. Generally, a minimum anti-pad clearance is specified in the design after balancing factors that tend to minimize the anti-pad size and those factors that tend to maximize anti-pad size. The anti-pads would be minimized to reduce noise by closely shielding adjacent pins with reference planes, to reduce electromagnetic interference (EMI) by minimizing aperture sizes in reference planes, and to maintain a strong reference to ground for single-ended signals and ground referenced differential signals. The anti-pads would be maximized to maximize voltage breakdown spacing between the pin and the reference plane, to increase manufacturability by reducing the chance of shorting, and reduce reflection in a high speed gigabit serial system by reducing the capacitive effect of a plated through hole (used instead of a via).

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices is an ever increasing pressure to produce PCBs having higher density designs. With increasingly higher density designs, the risk becomes greater that the established industry reliability specification for minimum dielectric spacing between hole wall and adjacent conductive features will be violated. There is also a possibility that with increased device density, the industry will lower the minimum dielectric spacing between features.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
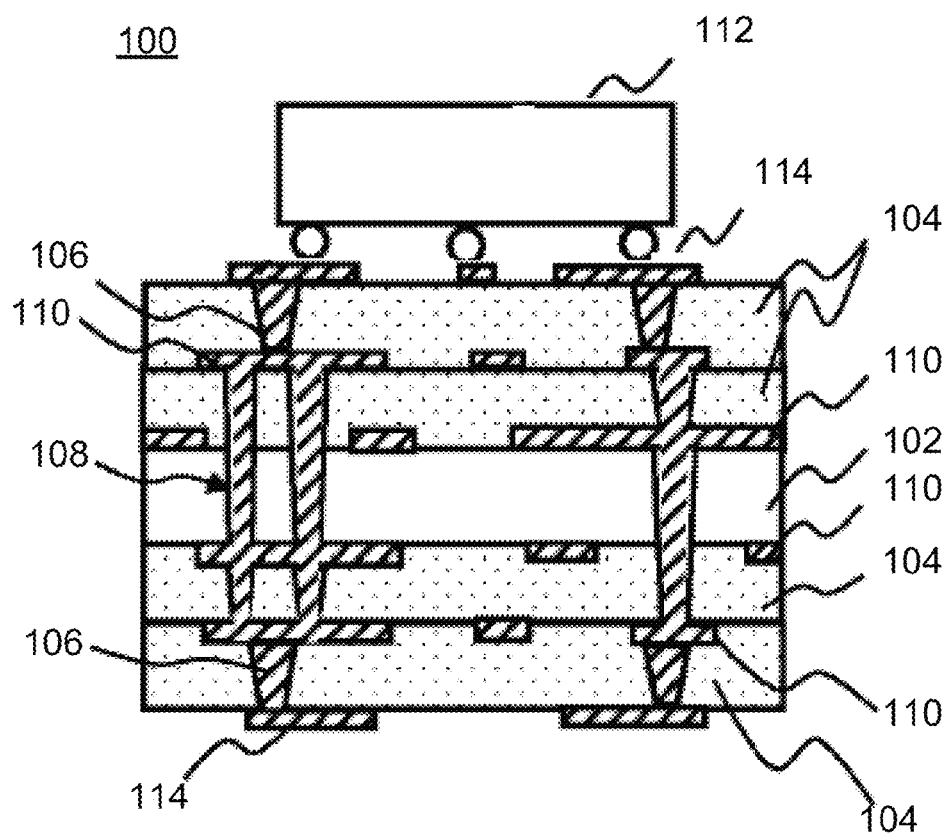
FIG. 1 is a cross-sectional view of a multi-layer semiconductor package according to one embodiment of the invention.

Referring now to FIG. 1, there is shown an illustrative cross-sectional view of semiconductor package 100. The package 100 may include a multi-layer circuit board comprising a core 102 including one or more dielectric layers 104 built-up on either side of the core 102. A plurality of conductive vias 106 may be provided to create electrically conductive paths through the dielectric layers 104. Plated through holes (PTHs) 108 may be provided to provide vertical connections through the core 102 to conductive layers 110. A semiconductor die 112 may be flip-chip connected to external conductive layers with solder balls 114.

Example materials for the core 102 may comprise ceramic or glass dielectrics. For example, a core 102 may comprise one or more selected from a group that comprises alumina, zirconia, carbides, nitrides, fused silica, quartz, sapphire, or any other ceramic or glass dielectric materials. In one embodiment, the ceramic materials for the core 102 may have a full density or an amount of porosity. In another embodiment, the materials for the core 10 may have a Young's modulus that may be higher than 20 GPa (e.g., at a room temperature). For example, the materials for the core 102 may have a Young's modulus that may be higher than 100 GPa (e.g., at a room temperature). In another embodiment, the materials for the core 102 may have a coefficient of thermal expansion (CTE) that may be in proximity to that of a semiconductor die to be coupled to the core 102. For example, the core 102 may comprise materials that may have a CTE lower than 12 ppm/° C. In one embodiment, the ceramic core 102 may integrate high-k ceramic thin film decoupling capacitors.

In yet another embodiment, the ceramic materials for the core 102 may comprise alumina that may be compounded with silica or other elements. In another embodiment, the ceramic materials may be compounded with, e.g., around 50% to 100% $Al_2O_3$. In another embodiment, a thickness of the core 102 may be determined by a Young's modulus and a stiffness of the core 102. In one example, a stiffness of the core 102 may be proportional to $Ed^3$, wherein E represents the Young's modulus and d represents the thickness. In one embodiment, the core 102 may have a thickness that may be from around 50 um to around 400 um; however, in some embodiments, the core 102 may have a different thickness. In another embodiment, the materials for the core 102 may have a thermal conductivity that may be from around 2 W/m·k to around 50 W/m·k. In another embodiment, the materials may have a dielectric strength from about 9 KV/mm to around 50 KV/mm. However, in some embodiments, other materials that have a different thermal conductivity and/or different dielectric strength may be utilized.

In one embodiment, the materials may have a dissipation factor lower than 0.01 (e.g., at 1 GHz). For example, the materials may have a dissipation factor lower than around 0.0003. In yet another embodiment, the materials may have a dielectric constant from e.g., around 5 to around 20 (e.g., at 1 GHz). In another embodiment, the material may have water absorption of around zero. However, in some embodiments, other ceramic or glass materials have a different combination of properties may be utilized.

In another embodiment, the core 102 may comprise inorganic materials that may have a Young's modulus higher than that of, e.g., polymer-based organic core materials. For example, the inorganic materials may have a Young's modulus that may be 2 to 14 multiples higher than that of the polymer-based organic core material; however, in some embodiments, the inorganic materials may have a different Young's modulus. In one embodiment, the core 102 may have a comparable or increased stiffness with a reduced core thickness.

The conductive layer 110 may be selectively patterned to provide a first set of one or more conductive elements such as traces, planes or interconnects pins on the upper and/or the lower side of the core 102. The dielectric layers 104 may be provided over the core 102. Example materials for the dielectric layer 104 may comprise particulate-filled such as Ajinomoto build-up film (ABF), or glass fiber reinforced epoxy resin such as prepreg materials, or other insulating or dielectric materials. In one embodiment, surface roughening methods and/or adhesion promotion methods such as silane treatment may be utilized to bond the dielectric layer 104 to the core 102. For example, one or more green sheets for the core 102 may be roughened, e.g., prior to firing, to increase surface roughness of the core 102.

A set of one or more through holes 108 may be selectively formed in the structure. In one embodiment, a laser may be used to provide the through holes 108. The laser may have a pulse width in a magnitude of a nanosecond. In some embodiments, the laser may have a pulse width that may be shorter than a nanosecond. In one embodiment, the laser may have a spectrum in a range from infrared radiation (IR) to deep ultraviolet (DUV). Examples for the laser may comprise Q-switched or mode-locked Nd:YAG or Nd:YVO4 lasers that may have a harmonic of 1064 nm, 532 nm, 355 nm, 266 nm or any other harmonics; Q-switched or mode-locked Nd:YLF lasers that may have a harmonic of 1053 nm, 527 nm, 351 nm, 263 nm or any other harmonics; or fiber laser. In another embodiment, the laser may have a pulse repetition frequency in a level from kHz to MHz; however, in some embodiments, any other lasers or means may be used.

Figure 2A:
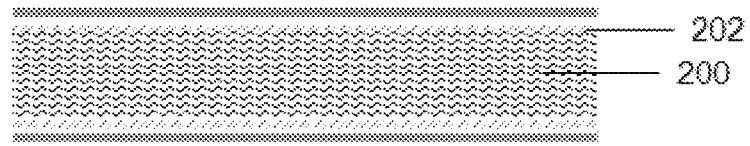
FIGS. 2A-2E are cross-sectional views illustrating the process for making plated through holes (PTHs) in a core according to one embodiment of the invention.
Figure 2B:
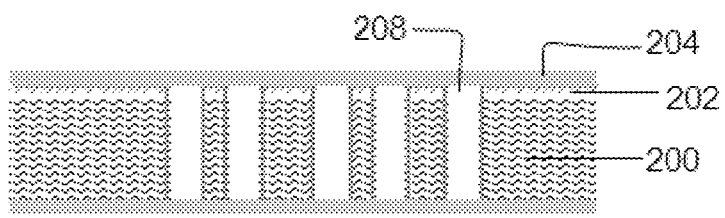

Referring to FIGS. 2A-2E, there is shown a process flow using laser drilling to make plated through hole (PTH) vertical interconnections through a core 200. In FIG. 2A there is shown a core 200 having a resin rich outer area 202. Resin-rich here implies to the zone of the substrate core from where the glass fibers and filler materials, used to provide desirable mechanical properties (such as high stiffness or lower CTE), are preferentially pulled into the inner side of the core of the substrate, leaving top and bottom most (~10-20 μm) approximately 90-100% organic epoxy resin. In FIG. 2B a through hole 208 may be laser drilled and have a diameter in a ranges from approximately 100 μm in the top and bottom side, and 60-90 μm at the center of the through hole (TH), making the effective TH look like an hour glass structure. In some embodiments, a through hole (TH) 208 may have a different size. In another embodiment, one or more redundant through holes (not shown) may be drilled in the structure. A copper (Cu) foil strip 204 may be laid down and thereafter a dry film resist (DFR) process utilized to create a pattern.

Figure 2C:
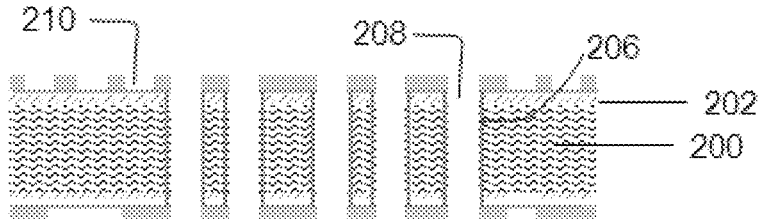
Figure 2D:
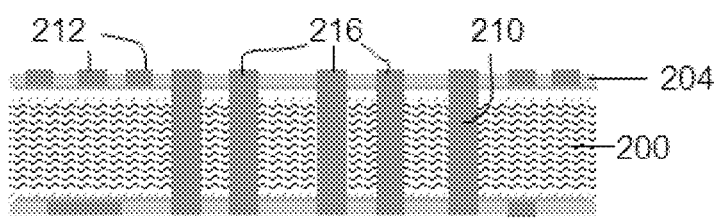

In FIG. 2C, the DFR may be exposed and then stripped to form finer line and space (FLS) patterning of (<20 μm wide) 210. In FIG. 2D the through holes 208 may be filled using, for example, electroless and then electrolytic copper plating to fill the vertical interconnections 210. In other embodiments, other conductive materials may be used. The copper may also fill other pattern voids to create conductive areas 212 as well.

Figure 2E:
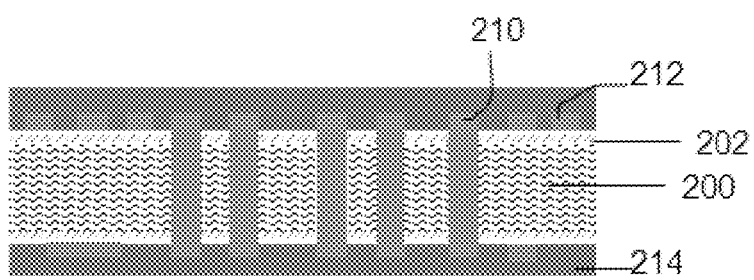

As shown in FIG. 2E, additional dielectric layers 214, such as, Ajinomoto build-up film (ABF), to begin the build-up process.

Referring again to FIGS. 2A through 2E, there is shown the cross section of the substrate panel during the sequential process steps to enable a substrate with reduced pad size via semi-additive process (SAP) on the core of the substrate. FIG. 2A depicts the incoming prepreg core 200 with resin rich area 202 just below the copper foil which is clad into the incoming core material. FIG. 2B shows substrate panel with copper foil stripped down to approximately 1-2 μm thick by etching, and then the through hole (TH) via is drilled through laser drilling 208, followed by electroless copper plating 206 and then one dry film resist is applied for subsequent patterning 204. Then FIG. 2C depicts the cross section of the exposed, developed and then stripped of the DFR material to form the trenches 210 for the routing traces. FIG. 2D depicts the cross sectional view of the substrate that is filled with electrolytic copper filling. This filling fills up the TH vias 210, traces 212 and the via pads 216 simultaneously. Then FIG. 2E shows the cross sectional view with DFR stripped completely, then dielectric material laminated on the front and back side of the substrate process 214. Then subsequent BU process may be continued.

Figure 3:
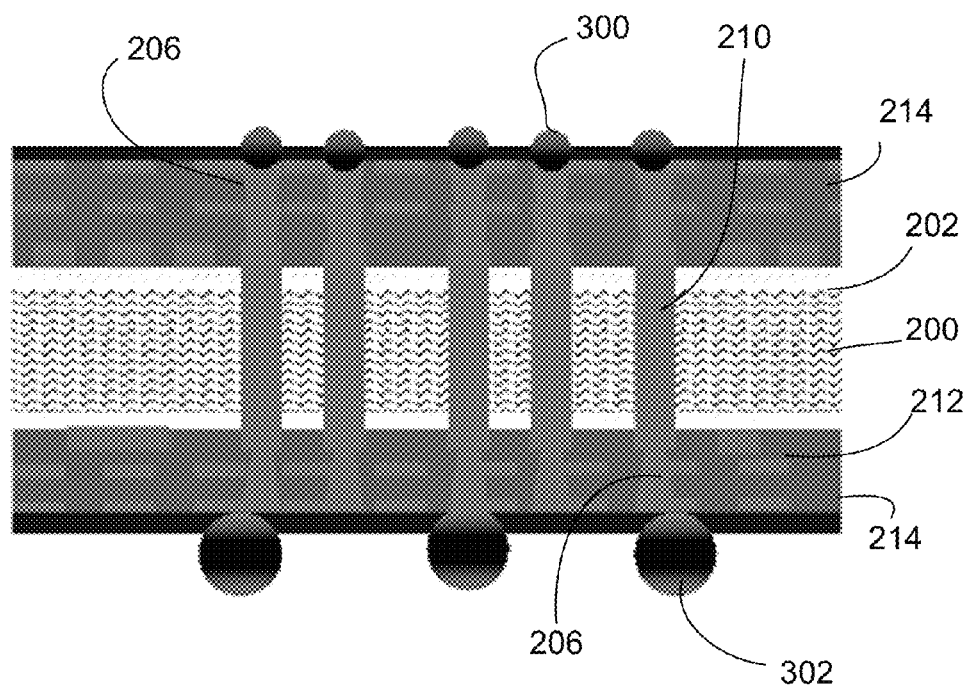
FIG. 3 is a cross-sectional view of a reduced pad substrate according to one embodiment of the invention.

FIG. 3 illustrates a cross sectional view of a reduced pad sized substrate according to one embodiment of the invention. The substrate may comprise a core 200 with a resin-rich outer layer 202 having one or more ABF build-up layers 214 on both side of the core 200. A plurality of plated through holes (PTHs) 210 may provide vertical electrical paths through the core 200 and connect to vias 206 and other conductive areas such as traces 212 in the various ABF layers 214. Solder balls 300 may also be provided on the upper side of the substrate, such as for flip chip connections to a semiconductor die as well as solder balls on the bottom side of the substrate.

Figure 4A:
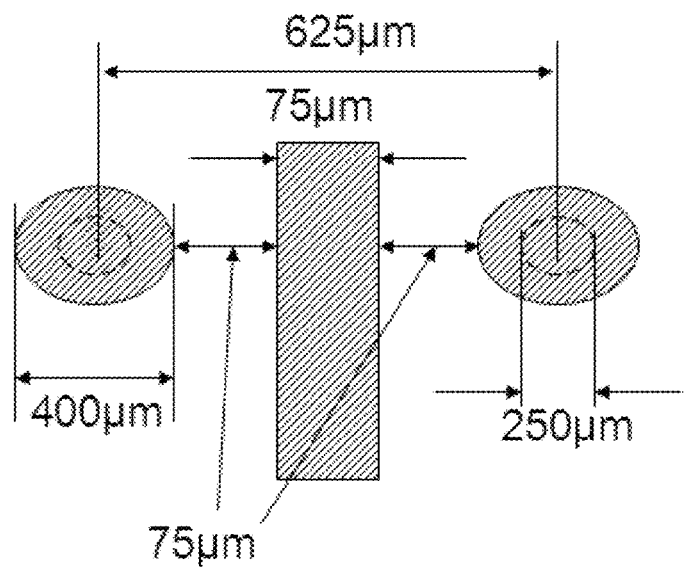
FIGS. 4A and 4B compares current PTH pads shown from a top view of the package 1F layer (only front side of the layer marked as 212 in FIG. 2E) with PTH pad, antipad, routing traces (also referred as fine line and space—FLS), and PTH pitch, according to embodiments of the invention.
Figure 4B:
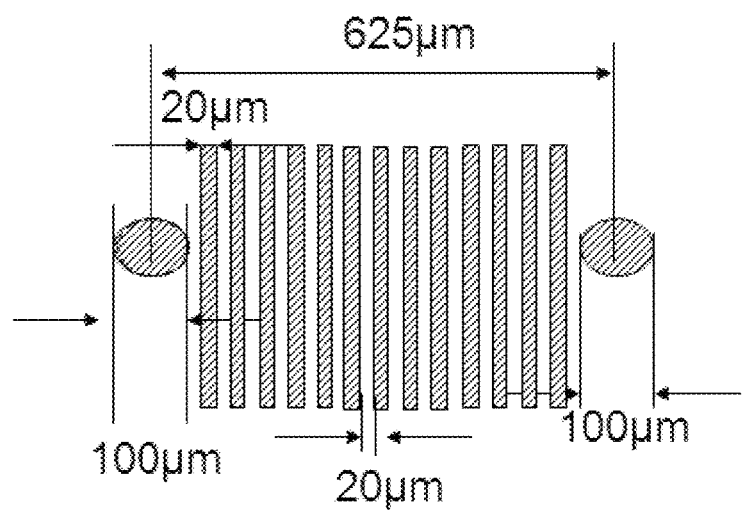

Referring to FIGS. 4A and 4B, according to embodiments of the invention, the laser drill size for creating the through holes in the core 200 may be approximately 100 um. This is substantially smaller than currently used drill sizes which may be upwards of 250 um. The usage of the laser drilling process may allow for pad sizes as small as 100 μm to 150 μm or even smaller (216 in FIG. 2D). Additionally, this allows for core routing (RTG) and line spacing (L/S) of 20 μm/20 μm due to the application of semi-subtractive process with copper foils in top resin rich core, or application of semi-additive process (SAP) in the core as shown through FIG. 2A-2E. With this process, the anti-pad size may be as small as 200 μm which allows for core referencing which is not possible in prior art designs.

Smaller pads allow more number of lines in between the pads (as shown in FIG. 4B). In addition, smaller pads can drive smaller anti-pad, so that the core layer can be used as a reference layer. Both of these advantages provide a package layer count reduction. In addition to these advantages the smaller pad is enabled by smaller drill size, by laser drilling to make the cost avoidance of mechanical drill, which can be filled by Cu plating making it more robust for package inductor based power delivery.

Reduced PTH pad and reduced trace width allows more numbers of traces to escape between the pads, reduces anti-pad size and reduces the PTH pitch. All these are beneficial for substrate package design. While, more number of traces allows more routing lines in the same package real estate making the package effective for higher input/output (IO) count at the same real estate, tighter PTH pitch makes the package size (form factor) effectively smaller.

Comparing FIGS. 4A and 4B, FIG. 4B shows the various traces and number of routing wires that can now pass between the pads as a function of pad size according to embodiments. Increased number of traces allows more signal can be confined in the layer 1F (212—in FIG. 2E). If this increase in signal count is adequate it is possible to eliminate a layer pair from the BU layer.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a substrate core comprising a resin extending throughout the substrate core, and glass fibers and filler material within the resin;
at least one resin rich outer area within the substrate core;
a plurality of plated through holes (PTHs) extending through the substrate core to provide vertical electrical paths through the core, the PTHs having a diameter of approximately 100 μm at a top and bottom side of the core; and
a plurality of trace lines between the PTHs having line spacing (L/S) of approximately 20 μm/20 μm.

2. The apparatus as recited in claim 1 further comprising:
build-up layers on the top and bottom side of the substrate core; and
vias in the build-up layers electrically connected to the PTHs.

3. The apparatus as recited in claim 1 wherein the resin rich outer areas are approximately 10-20 μm thick.

4. The apparatus as recited in claim 1 wherein the resin rich outer areas comprise approximately 90-100% organic epoxy resin.

5. The apparatus as recited in claim 2, further comprising pads electrically connected to the vias and a semiconductor die flip-chip connected to the pads.

6. A system, comprising:
a substrate core comprising a resin extending throughout the substrate core, and glass fibers and filler material within the resin;
at least one resin rich outer area within the substrate core;
a plurality of plated through holes (PTHs) extending through the substrate core to provide vertical electrical paths through the core, the PTHs having a diameter of approximately 100 μm at a top and bottom side of the core;
a plurality of trace lines between the PTHs having line spacing (L/S) of approximately 20 μm/20 μm;
build-up layers on the top and bottom side of the core;
vias in the build-up layers electrically connected to the PTHs;
pads electrically connected to the vias; and
a semiconductor die flip-chip connected to the pads.

7. The system as recited in claim 6 wherein the resin rich outer areas are approximately 10-20 μm thick.

8. The system as recited in claim 6 wherein the resin rich outer areas comprise approximately 90-100% organic epoxy resin.

9. An apparatus, comprising:
a substrate core comprising a resin extending throughout the substrate core, and glass fibers and filler material within the resin;
at least one resin rich outer area within the substrate core;
a plurality of plated through holes (PTHs) extending through the substrate core to provide vertical electrical paths through the core; and
a plurality of trace lines between the PTHs.

10. The apparatus as recited in claim 9 further comprising:
build-up layers on the top and bottom side of the substrate core; and
vias in the build-up layers electrically connected to the PTHs.

11. The apparatus as recited in claim 9 wherein the resin rich outer areas are approximately 10-20 μm thick.

12. The apparatus as recited in claim 9 wherein the resin rich outer areas comprise approximately 90-100% organic epoxy resin.

13. The apparatus as recited in claim 10, further comprising pads electrically connected to the vias and a semiconductor die flip-chip connected to the pads.

* * * * *